United States Patent
Castlebary et al.

(10) Patent No.: US 7,233,636 B2
(45) Date of Patent: Jun. 19, 2007

(54) TECHNIQUE FOR OVERSAMPLING TO REDUCE JITTER

(75) Inventors: Robert Allen Castlebary, Nevada City, CA (US); Robert Lloyd Sherman, Grass Valley, CA (US)

(73) Assignee: Thomson Licensing, Boulogne-Billancourt (FR)

( * ) Notice: Subject to any disclaimer, the term of this patent is extended or adjusted under 35 U.S.C. 154(b) by 718 days.

(21) Appl. No.: 10/692,079

(22) Filed: Oct. 23, 2003

(65) Prior Publication Data

US 2004/0179639 A1 Sep. 16, 2004

Related U.S. Application Data

(60) Provisional application No. 60/456,738, filed on Mar. 21, 2003.

(51) Int. Cl.
*H04L 7/00* (2006.01)
(52) U.S. Cl. .................................... 375/355
(58) Field of Classification Search ............... 375/355, 375/371, 376
See application file for complete search history.

(56) References Cited

U.S. PATENT DOCUMENTS

| | | | |
|---|---|---|---|
| 4,821,297 A | * | 4/1989 | Bergmann et al. .......... 375/376 |
| 5,400,370 A | * | 3/1995 | Guo ........................... 375/371 |
| 5,761,254 A | | 6/1998 | Behrin ....................... 375/355 |
| 2003/0095619 A1 | * | 5/2003 | Vallet et al. ................ 375/355 |

OTHER PUBLICATIONS

Park J-Y et al.: "A 1.0 GBPS CMOS Oversampling Data Recovery Circuit with Fine Delay Generation Method" IEICE Transactions on Fundamental of Electronics, Communications and Computer Sciences, Institute of Electronics Information and Comm. Eng. Toyko, JP, vol. E83-A, No. 6 Jul. 13, 1999 pp. 1100-1105, XP001032162.

* cited by examiner

*Primary Examiner*—Emmanuel Bayard
*Assistant Examiner*—Lawrence Williams
(74) *Attorney, Agent, or Firm*—Joseph J. Laks; Robert B. Levy

(57) ABSTRACT

To achieve improved jitter performance within prescribed bandwidth constraints, a receiver (140) samples a digital signal (11) upon each of n periodic sample clock pulses that occur during the interval t, where n is chosen such that $\log_2(n+1)$ is an integer (x) greater than zero. At the each of each interval t, the receiver generates a x+1-bit sample value having a first bit indicating the value of the digital signal being sampled, and x remaining bits which collectively indicate a sample interval during which the digital signal changed states if such a change did occur When a change does occur, the receiver inverts the first bit of each sample value upon decoding to coincide with the change in the digital signal.

8 Claims, 2 Drawing Sheets

TECHNIQUE FOR OVERSAMPLING TO REDUCE JITTER

CROSS REFERENCE TO RELATED APPLICATION

This application claims priority under 35 U.S.C. 119(e) to U.S. Provisional Patent Application Ser. No. 60/456,738, filed Mar. 21, 2003, the teachings of which are incorporated herein.

TECHNICAL FIELD

This invention relates to a technique for sampling an asynchronous digital signal to achieve reduced jitter performance

BACKGROUND ART

In various types of electronic systems, a need exists to sample a digital signal to determine its state, i.e., to determine whether the signal is at a logical "1" or logical "0" level. In practice, such sampling occurs periodically, typically in response to a periodic sample clock pulse. Ideally, sampling should occur at a sufficiently high frequency to minimize jitter, generally defined as the period of uncertainty between a change in state of the sampled signal and the next sample clock pulse. In a worst-case scenario, the sampled signal will change states just after the occurrence of a sample clock, so that nearly an entire sample clock interval will elapse before sampling the input signal again.

Increasing the sampling frequency will reduce the period of uncertainty and thus yield improved jitter performance. However, increasing the sampling frequency will yield more samples. In some electronic systems, bandwidth constraints limit the number of samples capable of being transmitted within a given interval. In such systems, limited opportunities exist for jitter performance improvement.

Thus, there is need for a technique tat achieves increased jitter performance in bandwidth-limited systems.

BRIEF SUMMARY OF THE INVENTION

Briefly, in accordance with a preferred embodiment of the present principles, there is provided a method for sampling a digital signal that yields improved jitter performance. The method commences by sampling the digital signal n times during a given interval, with n chosen such that $\log_2(n+1)$ is an integer x greater than zero. After each interval t, an x+1 bit data block is generated. The first bit represents the state of the sampled signal, and the remaining x bits indicate the sample interval (i.e., the particular one of the n clock pulses) during which a change, if any, occurred. If a change did occur, then sample value is inverted upon decoding to coincide with the change in the sample value that occurred during the indicated sample interval.

DETAILED DESCRIPTION

Figure 1:
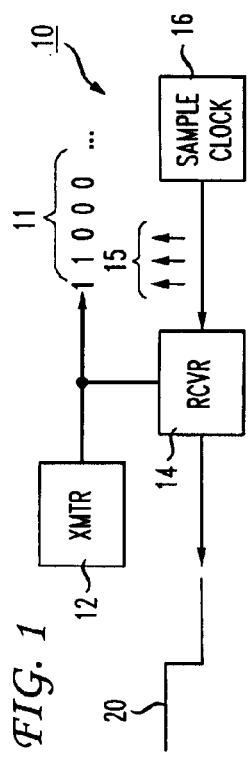
FIG. 1 depicts a block schematic diagram of an apparatus in accordance with the prior art for sampling an asynchronous digital signal.

FIG. 1 depicts a prior art apparatus 10 for sampling an asynchronous digital signal 11 generated by a transmitter 12. The transmitter 12 can take the form of any type of digital device that produces an asynchronous digital output signal. In other words, the output signal 11 of the transmitter 12 changes states between a logic "1" level and a logic "0" level a periodically. The sampling apparatus 10 includes a receiver 14 coupled to the output of the transmitter 12 for detecting the state of the signal 11 in response to each of a sequence of periodic clock pulses 15 from a sample clock 16. The sample clock 16 generates m uniformly spaced clock pulses 15 during an interval of duration t. In the illustrated embodiment, m=5 although the value of m could be larger or smaller.

Figure 2:
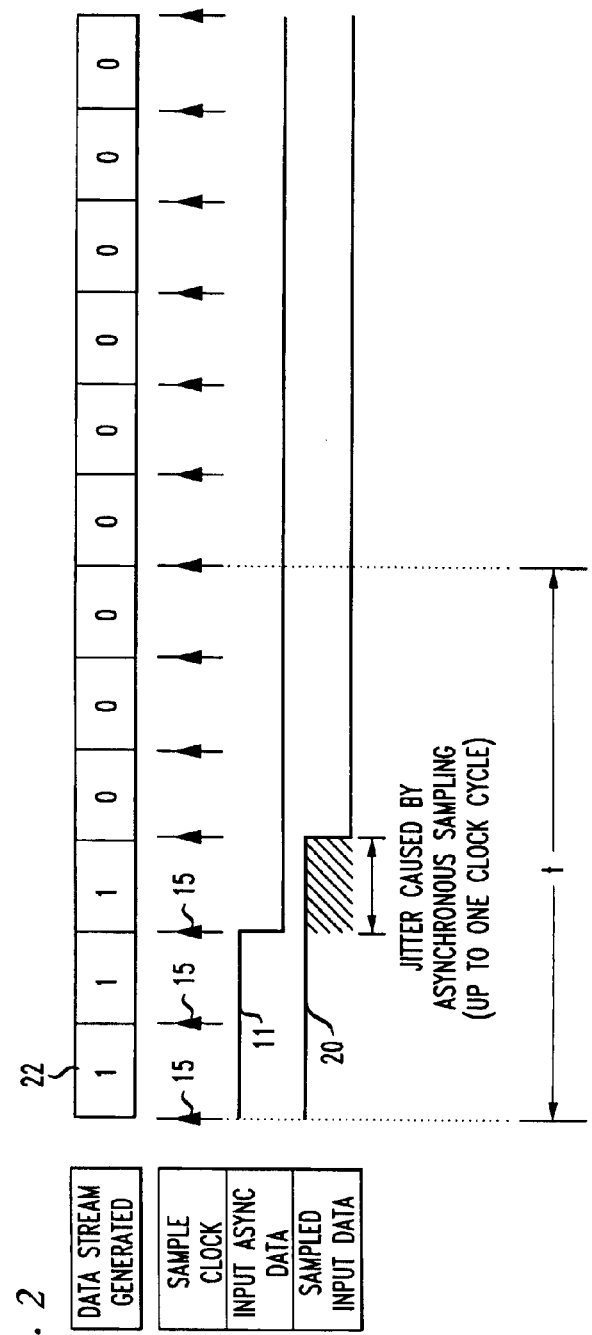
FIG. 2 depicts a time line showing the relationship over time among the digital signal undergoing sampling, the sample value obtained and the sample clock pulses generated by a sample clock comprising part of the apparatus of FIG. 1.

FIG. 2 depicts a timing chart that shows the relationship over time between the output signal 11 of the transmitter 12 of FIG. 1 and the clock pulses 15 generated by the sample clock 16 of FIG. 1. In the example depicted in FIG. 2, the signal 11 undergoes a transition from a logic "1" state to a logic "0" level shortly after the occurrence of the second of the clock pulses 15 generated by the sample clock 16 of FIG. 1. Following receipt of the second clock pulse 15, the receiver 14 of FIG. 1 will again sample the signal 11. Upon finding the signal 11 at a logic "1" level, the receiver 14 will maintain its output signal 20 in FIG. 2 at a logic "1" level as before. The output signal 20 of the receiver 14 remains at this logic state until the next sampling interval following receipt of the next (i.e., the third) clock pulse 15. When clocked again by the sample clock 16 of FIG. 1 (i.e., the fourth clock pulse occurrence), the receiver 14 of FIG. 2 now finds that the amplitude of the signal 11 has dropped to a logic "0" level. Accordingly, the receiver output signal 20 shown in FIG. 2 now drops to a logic "0" level.

The shaded portion of the receiver output signal 20 depicted in FIG. 2 corresponds to the lag between the change in state of the signal 11 and the change in state of the receiver output signal. This lag, referred to in the art as jitter, results from the periodic sampling of an asynchronous signal and can last up to one clock cycle. Increasing the sampling rate (i.e., increasing the number of sample clock pulses per time interval t) will yield more samples, thus reducing the amount of jitter. However, some electronic systems have bandwidth constraints that limit the number of samples capable of being transmitted during a given interval. In such systems, the option of increasing the sampling rate to improve jitter performance does not exist.

Figures 3, 4:
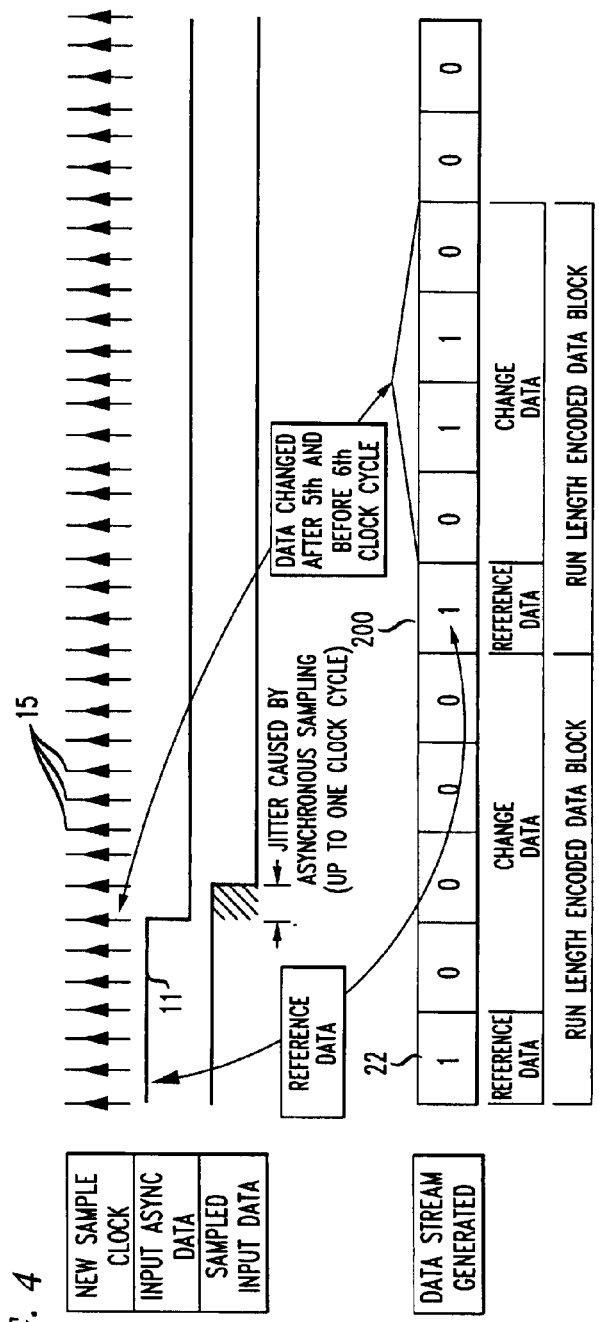
FIG. 3 depicts a block schematic diagram of an apparatus in accordance with the present principles for sampling an asynchronous digital signal with improved jitter performance.
FIG. 4 depicts a time line showing the relationship over time among the digital signal undergoing sampling, the sample value obtained and the sample clock pulses generated by a sample clock comprising part of the apparatus of FIG. 3.

FIG. 3 depicts a block schematic diagram of a system 100, in accordance with a preferred embodiment of the present principles, for sampling an asynchronous digital signal 11 produced by transmitter 12 to achieve improved jitter performance while maintaining bandwidth constraints. The system 100 includes a receiver 140 that samples the output signal 11 upon receipt of each of a sequence of periodic clock pulses 150 generated by a clock 160. As compared to the sample clock 16 of FIG. 1 which generates m uniformly spaced periodic pulses 15 during each interval t, the sample clock 160 of FIG. 3 generates n uniformly spaced pulses 150 during the same interval t where n>m. In the illustrated embodiment, n=15, although n could assume larger or smaller values, so long as $\log_2(n+1)$ is an integer x greater than zero. Rather than generating a single bit sample value like the receiver 14 of FIG. 1, the receiver 140 of FIG. 3 generates a sample comprised of an x+1 bit word 200 during each interval t. The x+1 bit word 200 indicates the sample value of the signal 11 and also identifies the particular one of the n clock cycles within the interval t during the signal 11 underwent a change in state if such a change did in fact occur.

FIG. 4 depicts a timing chart that shows the relationship over time between the signal 11 generated byte transmitter 12 of FIG. 2 and the pulses 150 generated by the clock 160. As shown in FIG. 4, during each sample interval of duration t, the receiver 140 of FIG. 13 receives a successive ant of fifteen clock pulses 150, each pulse causing the receiver to sample the input signal 11. At the end of every interval t, the receiver 140 generates a five-bit word 200 whose first bit (hereinafter referred to as a "reference data" bit) indicates the state of the input signal 11. The remaining four bits collectively identity the particular one of the fifteen clock cycles within the interval t during which the signal 11 changed state, assuming such a change occurred.

As can be appreciated from the timing chart depicted in FIG. 4, the last four bits of the five-bit sample will uniquely identify each of the fifteen clock pulses within the interval t. Thus for example, the four-bit binary word (0 0 0 0) serves to identify the first of the fifteen pulses when there is no change in the fifteen-clock pulse period, whereas the four bit-binary word (1 1 1 1) identifies the fifteen$^{th}$ clock pulse when a change occurred at that time. In this way, the five-bit sample generated by the receiver 140 of FIG. 3 provides a single sample during each interval t with the same precision as fifteen individual samples, thus, improving jitter performance without violating bandwidth constraints. If a change did occur in the value of the signal, then sample value in the five-bit word 200 is inverted upon decoding to coincide with the change in the sample that occurred.

The sampling method performed by the receiver 140 constitutes a form of run-length encoding which yields a single sample (referred to as a Run Length Encoded Data Block or RLEDB) of x bits in length with the same precision as n samples, provided that $\log_2(n+1)=x$. This scheme trades the maximum sample acquisition rate of a given communications link bandwidth for improved jitter performance. In the illustrated embodiment, a compression factor of 3.2-to-1 is achieved (16 samples in five periods), so jitter is reduced by the same ratio. Other compression factors are possible.

The only drawback of this method is that the signal 11 cannot undergo a change in state more than once during each interval t. In other words, the signal 11 cannot undergo more than one change for each RLEDB. If the signal 11 were to change states two or more times per RLEDB, data will become lost.

The foregoing describes a technique for sampling an asynchronous signal with improved jitter performance while maintaining bandwidth constraints.

What is claimed is:

1. A method for sampling a digital signal yielding improved jitter performance within prescribed bandwidth constraints, comprising the steps of:

periodically sampling the digital signal n times during every interval t, with n chosen such that $\log_2(n+1)$ is an integer (x) greater than zero;

generating a x+1-bit sample value after each interval t, the sample value having a first bit indicating the value of the digital signal being sampled, and x remaining bits which collectively indicate a sample interval during which the digital signal changed states if such a change did occur, and inverting the first bit of each sample value upon decoding to coincide with the change in the digital signal.

2. The method according to claim 1 wherein n=15 and x equals 4.

3. An apparatus for sampling a digital signal yielding improved jitter performance within prescribed bandwidth constraints, comprising:

a sample clock for generating n periodic clock pulses during every interval t, with n chosen such that $\log_2(n+1)$ is an integer (x) greater than zero;

a receiver for generating a x+1-bit sample value after each interval t, the sample value having a first bit indicating the value of the digital signal being sampled, and x remaining bits which collectively indicate a sample interval during which the digital signal changed states if such a change did occur, and the receiver inverting the first bit of each sample value upon decoding to coincide with the change in the digital signal.

4. The apparatus according to claim 1 wherein n=15 and x equals 4.

5. A method for sampling a digital signal yielding improved jitter performance within prescribed bandwidth constraints, comprising the steps of:

periodically sampling the digital signal n times during every interval t, with n chosen such that $\log_2(n)=<x$ where x is an integer;

generating a x+1-bit sample value after each interval t, the sample value having a first bit indicating the value of the digital signal being sampled, and x remaining bits which collectively indicate a sample interval during which the digital signal changed states if such a change did occur, and inverting the first bit of each sample value upon decoding to coincide with the change in the digital signal.

6. The method according to claim 5 wherein n=15 and x equals 4.

7. An apparatus for sampling a digital signal yielding improved jitter performance within prescribed bandwidth constraints, comprising:

a sample clock for generating n periodic clock pulses during every interval t. with n chosen such that $\log_2(n)=<x$ where x is an integer a receiver for generating a x+1-bit sample value after each interval t, the sample value having a first bit indicating the value of the digital signal being sampled, and x remaining bits which collectively indicate a sample interval during which the digital signal changed states if such a change did occur, and the receiver inverting the first bit of each sample value upon decoding to coincide with the change in the digital signal.

8. The apparatus according to claim 7 wherein n=15 and x equals 4.

* * * * *